United States Patent [19]

Palanisamy

[11] Patent Number: 4,819,056
[45] Date of Patent: Apr. 4, 1989

[54] HYBRID THICK FILM CIRCUIT DEVICE
[75] Inventor: Ponnusamy Palanisamy, Kokomo, Ind.
[73] Assignee: Delco Electronics Corporation, Kokomo, Ind.
[21] Appl. No.: 94,044
[22] Filed: Sep. 8, 1987

Related U.S. Application Data
[63] Continuation of Ser. No. 881,669, Jul. 3, 1986.

[51] Int. Cl.⁴ .................... H01L 27/02; H01L 23/16
[52] U.S. Cl. ...................................... 357/80; 357/51; 357/40; 357/74; 357/75
[58] Field of Search ................ 357/51, 74, 40, 75, 357/80

[56] References Cited

U.S. PATENT DOCUMENTS

| | | | |
|---|---|---|---|
| 3,255,511 | 6/1966 | Weissenstern et al. | 357/75 |
| 3,555,364 | 1/1971 | Matcovich | 357/75 |
| 3,560,256 | 2/1971 | Abrams | 357/75 |
| 3,916,434 | 10/1975 | Garboushian | 357/80 |
| 4,000,054 | 12/1976 | Marcantonio | 204/192 |
| 4,123,564 | 10/1978 | Ajima t al. | 427/85 |
| 4,454,529 | 6/1984 | Philofsky et al. | 357/51 |
| 4,636,918 | 1/1987 | Jodoin | 357/75 |
| 4,654,694 | 3/1987 | Val | 357/51 |

FOREIGN PATENT DOCUMENTS

| | | | |
|---|---|---|---|
| 54-19360 | 2/1979 | Japan | 357/51 |
| 56-55067 | 5/1981 | Japan | 357/40 |
| 60-86850 | 5/1985 | Japan | 357/40 |

Primary Examiner—Martin H. Edlow
Assistant Examiner—Gregory A. Key
Attorney, Agent, or Firm—Domenica N. S. Hartman

[57] ABSTRACT

A hybrid thick film chip device comprising two or more electrical components mounted in parallel on a single substrate and having common terminals for electrical interconnection to other devices or to circuit boards or the like. In one embodiment, the components comprise a resistor and a capacitor disposed on one surface of the substrate. In another embodiment the resistor is on one surface of the substrate and the capacitor is on the opposite surface. The device is particularly advantageous in forming networks.

6 Claims, 2 Drawing Sheets

HYBRID THICK FILM CIRCUIT DEVICE

This patent application is a continuation of prior U.S. patent application Ser. No. 881,669 filed on July 3, 1986.

INTRODUCTION

This invention is in the field of thick film circuit devices and relates specifically to a hybrid thick film device having multiple electrical components on a single substrate.

BACKGROUND OF THE INVENTION

It is known to manufacture a circuit device such as a resistor or thermistor by printing or otherwise depositing a thick film formulation on a dimensionally stable substrate and thereafter forming terminations to connect the thick film device to a circuit board or the like. One especially advantageous thick film device and a method of high efficiency manufacture therefor are disclosed in the co-pending application "Thick Film Chip Electrical Circuit Device and Method of Manufacture," U.S. Ser. No. 881,670, filed July 3, 1986, filed concurrently herewith in the name of P. Palanisamy and assigned to the General Motors Corporation.

Although composite thick film chip devices are known, they generally consist of physically and electrically separate devices mounted on separate surface areas of a common substrate so as to require respective terminations for mounting and electrical interconnection with other devices. The prior art does not, however, suggest the physical integration of two or more electrical components of the same or differing electrical character in a thick film device susceptible of mounting or interconnection by a single set of terminations.

SUMMARY OF THE INVENTION

It is the principal object of the present invention to provide a thick film, substrate-mounted (chip) device of the type having two or more electrical components such as resistors, thermistors and capacitors, of the same or differing electrical characteristics, co-mounted on a single chip and having common terminations.

In general, this is accomplished by and through a combination consisting of an insulative inert substrate having opposite plane surfaces, respective sets of terminals or terminations on opposite ends of each of the plane surfaces, said terminations or terminals on each end being interconnected with one another in pairs, and first and second thick film components extending between and being electrically connected to the sets of terminals.

In practice, at least one of the thick film components is physically deposited on a surface of the substrate and the substrate is easily mounted on a circuit board by means of a solder or conductive epoxy terminations.

In one preferred embodiment hereinafter described in detail, a first component such as a resistor or thermistor is printed or similarly deposited on a substrate surface and a thick film capacitor is mounted over and in parallel with the deposited thick film resistor or thermistor; the entire device is then mounted by means of terminals on the bottom surface of the substrate.

In a second embodiment hereinafter described in detail, the thick film deposited resistor is on one surface of the substrate and a capacitor is attached by means of appropriate terminations on the opposite side of the substrate, the capacitor and resistor being electrically interconnected by means hereinafter described.

DETAILED DESCRIPTION OF THE ILLUSTRATIVE EMBODIMENTS

Figure 1:
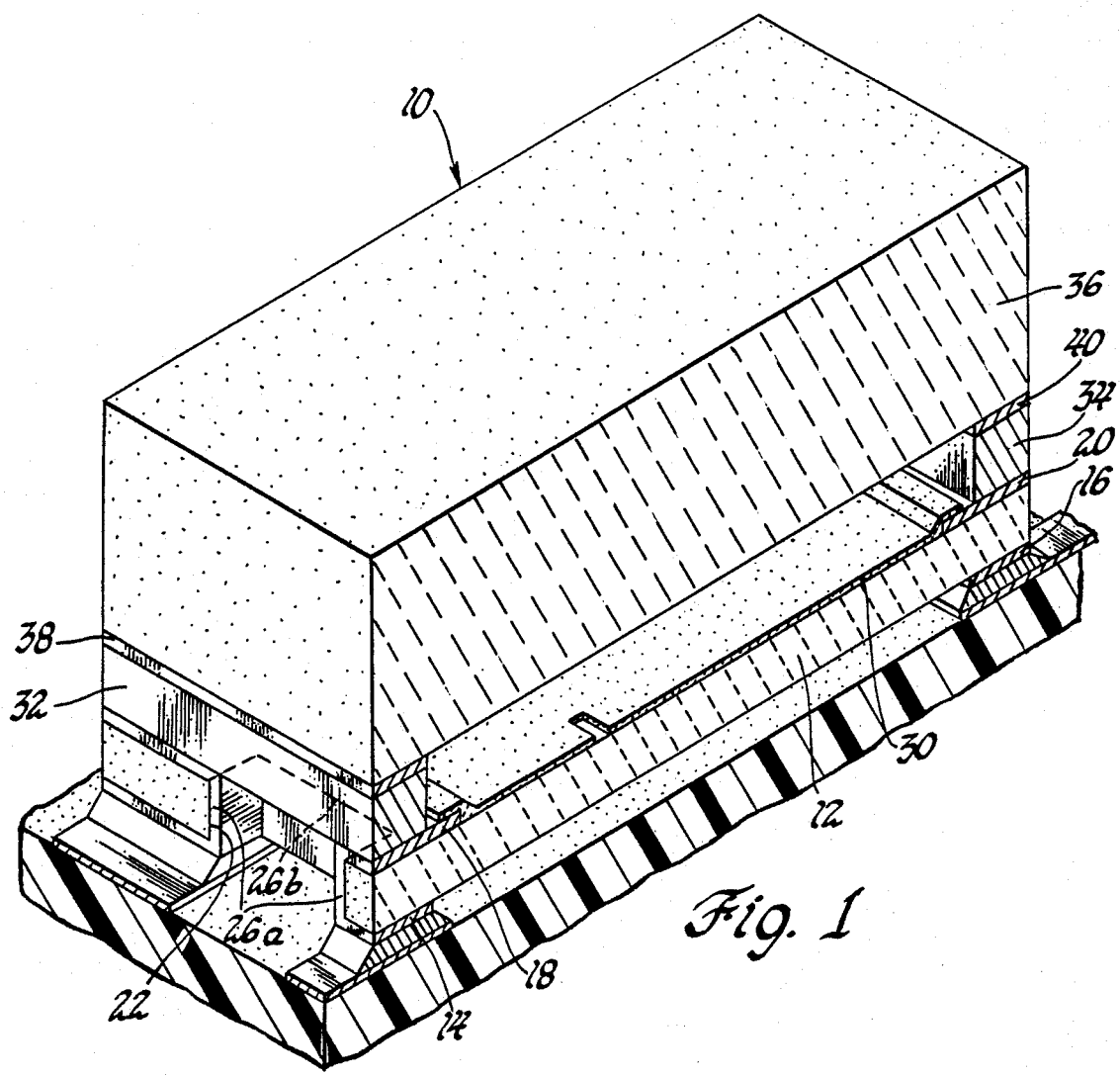
FIG. 1 is a perspective view of a first embodiment of the invention.
Figure 2:
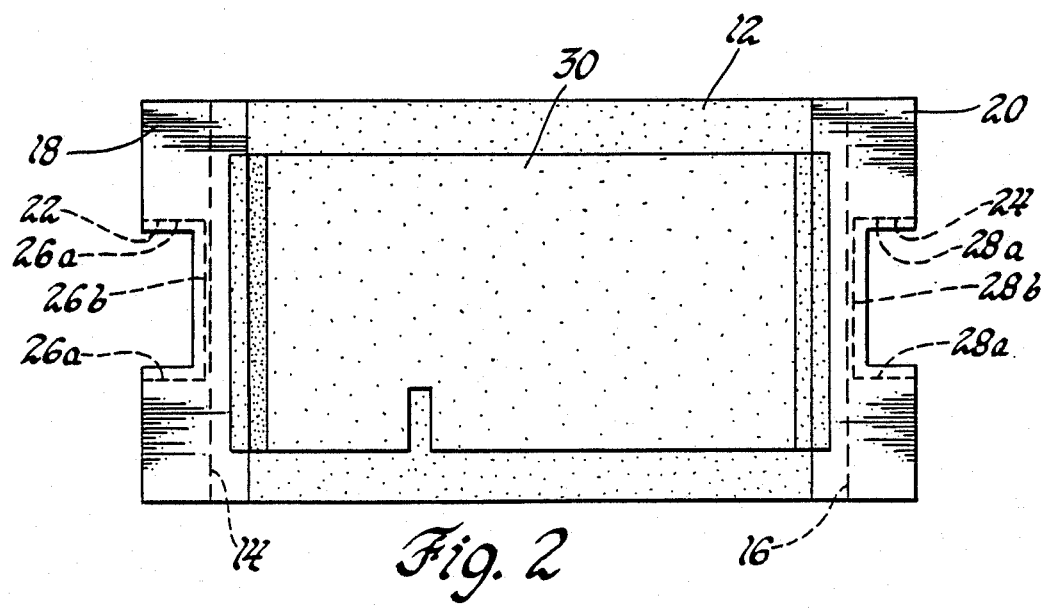
FIG. 2 is a plan view of the lower portion, including the substrate, of the device of FIG. 1.

Referring to FIGS. 1 and 2, a hybrid thick film device 10 is shown to comprise a generally rectangular substrate 12 of electrically insulative, inert, and dimensionally stable material having a low thermal coefficient of expansion such as fired alumina. Substrate 12 exhibits generally planar top and bottom parallel surfaces; on the opposite ends of the bottom surface terminals 14 and 16 extending the full width of the substrate have been deposited and fired in place. On the top surface of substrate 12, terminals 18 and 20 are deposited and fired in place. As best shown in FIG. 2, the generally rectangular substrate 12 has open rectangular channels 22 and 24 formed in the end surfaces thereof, the surfaces 26a, 26b, 28a and 28b of such channels being printed over with electrically conductive material to form electrically conductive interconnections between the terminals, whereby terminals 14 and 18 are electrically interconnected as a pair and terminals 16 and 20 are electrically interconnected as a pair. Such printing over can be done at the same time that the terminals 14–20 are printed.

In the hybrid device of FIGS. 1 and 2, a thick film 30 of resistor formulation is deposited on the top surface of the substrate 12 so as to extend between and be electrically interconnected with the terminals 18 and 20. The film 30 is of slightly lesser width than the substrate 12 and overlaps the terminals 18 and 20 as shown to ensure good electrical contact therewith.

In addition, the device 10 comprises solder or conductive epoxy pads 32 and 34 mounted on top of the terminals 18 and 20 to receive a thick film capacitor 36 having predeposited parallel terminals 38 and 40 on one plane surface thereof. Although not shown in the drawing, a passive coating of glass or epoxy may overlay the resistor 30 to protect it from physical damage of the type which might tend to alter its electrical value.

In the arrangement shown in FIG. 1, the resistor 30 and the capacitor 36 are electrically connected in parallel and both devices may be simultaneously and conveniently mounted by means of the single pair of terminals 14 and 16. As is more fully disclosed in the co-pending application "Thick Film Chip Electrical Device and Method of Manufacture" referred to above, device 10 is conveniently mounted to a circuit board having spaced apart terminal pads by means of solder or epoxy terminations to which the terminals 14 and 16 are connected. Although the channels 22 and 24 which are printed or deposited over with conductive material represent the preferred interconnection of the upper and lower terminal sets, other approaches such as the formation and plating of holes between the surfaces of the substrate 12 may also be employed.

Figure 3:
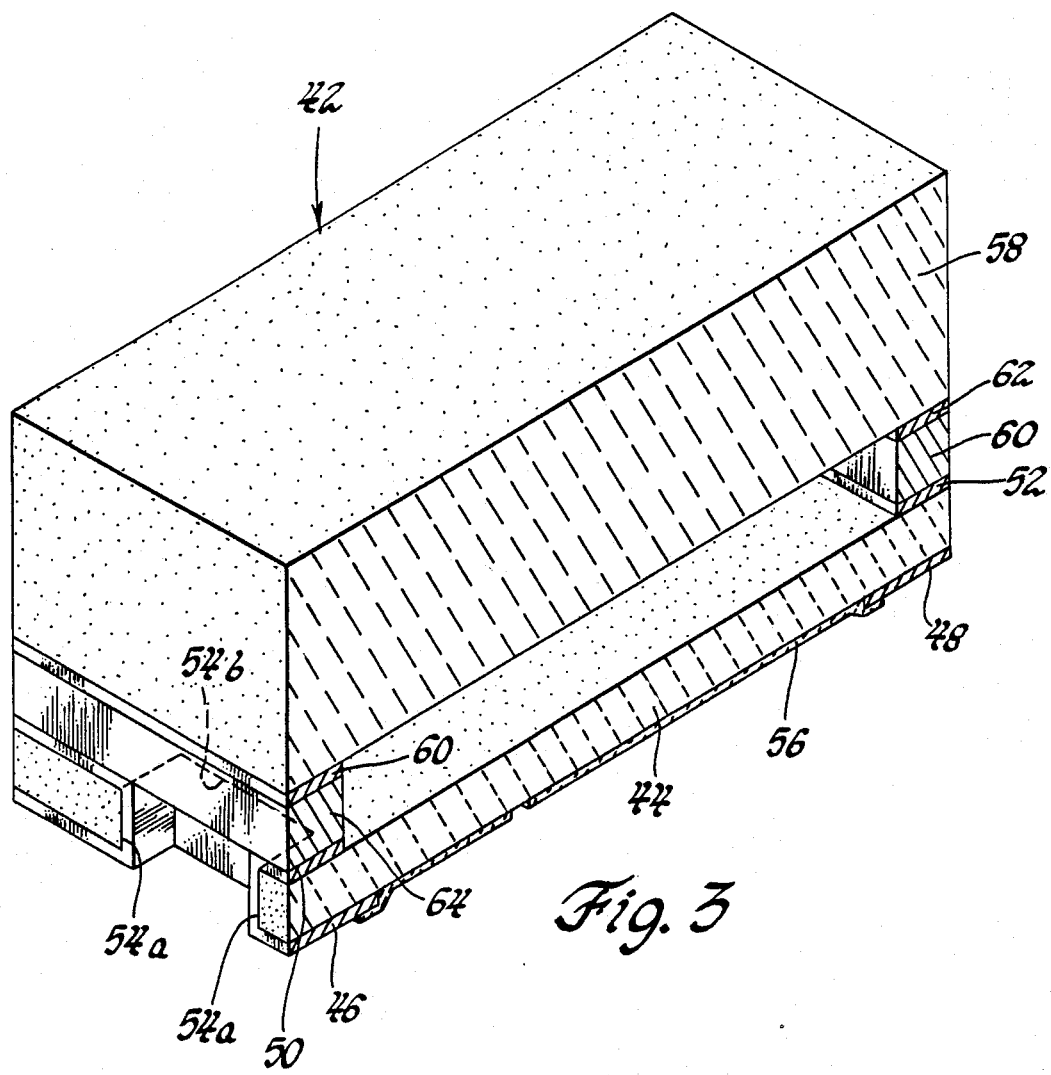
FIG. 3 is a perspective view of a second embodiment of the invention.

Referring now to FIG. 3, a second somewhat different hybrid device 42 is disclosed. Device 42 comprises a generally rectangular substrate 44 of material having similar or identical characteristics as the material from which substrate 12 is manufactured. On the bottom surface of the substrate 44, terminals 46 and 48 are deposited and fired in place and on the top surface terminals 50 and 52 are similarly deposited and fired in place. End channels having electrically conductive coated surfaces 54a and 54b interconnect the upper and lower terminals 46 and 50, and 48 and 52, into pairs in the same manner as was described in detail with reference to FIGS. 1 and 2.

A thick-film resistor 56 is deposited on the lower surface of the substrate 44 so as to extend between, somewhat overlap, and be electrically connected to the terminals 46 and 48. As will be apparent to those skilled in the art, the ohmic value of thick resistor film 56 may be selected by composition and geometry and altered by laser trimming or an equivalent technique.

A thick film capacitor 58 is mounted on the top surface of the substrate 44 by means of terminals 60 and 62 which are deposited on a lower surface of the capacitor 58 at spaced apart surface areas adjacent the longitudinally opposite ends. Solder or epoxy pads 64 and 66 join the terminals 50, 60 and 52, 62 of the substrate 44 and capacitor 58 to physically and electrically integrate the components of the device 42. The pads 64 and 66 may be thinner than is suggested by the illustration of FIG. 3, sufficient space between capacitor 58 and substrate 44 to dissipate heat being a consideration.

The devices 10 and 42 shown in the drawing have numerous advantages over prior art composite devices such as the compatibility with batch or large scale array production techniques also more fully described in the aforementioned co-pending application and also in the fact that the multiple components are arranged over one another in the vertical plane rather than in a horizontal plane which requires a device having a large surface area; i.e., the components are "stacked" rather than spread out horizontally.

It will be apparent to those skilled in the art that the device 42 of FIG. 3 may include a third component in the unused space between the substrate 44 and the bottom surface of the thick film capacitor 58. Such a third component might be another resistor to increase the power capacity of the overall device.

The embodiments of the invention in which an exclusive property or privilege is claimed are defined as follows:

1. A hybrid thick film chip device comprising:
   an insulative substrate having first and second opposite plane surfaces;
   a first set of end terminals on opposite ends of one plane surface;
   a second set of end terminals on opposite ends of the other plane surface;
   means for electrically interconnecting the terminals a each end into pairs;
   a thick film electrical resistor deposited on one of said plane surfaces of said substrate and electrically connected to said first and second sets of terminals; and
   a second thick film component extending between one of said set of terminals and electrically connected to said first and second sets of terminals.

2. A device as set forth in claim 1 wherein said second thick film component is mounted in parallel spaced relationship over said resistor and is electrically connected to and mounted on said first set of end terminals.

3. A device as defined in claim 1 wherein said resistor is deposited on one surface of said substrate and said second component is mounted between said terminals on the opposite surface of said substrate.

4. A device as defined in claim 1 wherein the means for electrically interconnecting the terminals at each end into pairs comprises channels formed in the ends of said substrate and electrical means deposited on respective surfaces of said channels.

5. A device as claimed in claim 4 wherein the channels are open slots formed in the end surfaces of the substrate.

6. A device as defined in claim 1 wherein one of the components is a capacitor.

* * * * *